(12) United States Patent
Miyake et al.

(10) Patent No.: US 10,541,278 B2
(45) Date of Patent: Jan. 21, 2020

(54) DISPLAY DEVICE

(71) Applicant: Japan Display Inc., Tokyo (JP)

(72) Inventors: Hidekazu Miyake, Tokyo (JP);
Kazufumi Watabe, Tokyo (JP);
Yoshinori Ishii, Tokyo (JP)

(73) Assignee: Japan Display Inc., Tokyo (JP)

( * ) Notice: Subject to any disclaimer, the term of this patent is extended or adjusted under 35 U.S.C. 154(b) by 264 days.

(21) Appl. No.: 15/660,276

(22) Filed: Jul. 26, 2017

(65) Prior Publication Data
US 2018/0040671 A1    Feb. 8, 2018

(30) Foreign Application Priority Data

Aug. 3, 2016 (JP) ................ 2016-152758

(51) Int. Cl.
*H01L 27/32* (2006.01)
*G06F 3/041* (2006.01)
*G06F 3/044* (2006.01)

(52) U.S. Cl.
CPC .......... *H01L 27/323* (2013.01); *G06F 3/0412* (2013.01); *H01L 27/3276* (2013.01); *G06F 3/044* (2013.01)

(58) Field of Classification Search
CPC . H01L 27/323; H01L 27/3276; G06F 3/0412; G06F 3/044
See application file for complete search history.

(56) References Cited

U.S. PATENT DOCUMENTS

2013/0207928 A1* 8/2013 Takata ................ G06F 3/0414
345/174
2015/0362774 A1* 12/2015 Ide ...................... G02F 1/13338
349/12
2016/0155782 A1* 6/2016 Sato .................... H01L 27/3227
257/82

FOREIGN PATENT DOCUMENTS

JP          2016-1233 A    1/2016

* cited by examiner

*Primary Examiner* — Andrew Sasinowski
(74) *Attorney, Agent, or Firm* — Michael Best & Friedrich LLP

(57) ABSTRACT

The organic EL display device includes a TFT substrate on which a scanning line extends in a first direction, a video signal line extends in a second direction, and a pixel having an anode, an organic EL layer, and a cathode is formed on a region enclosed with the scanning line and the video signal line. A first detection electrode extends in the first direction above the pixel via insulation films. A counter substrate is disposed while covering the first detection electrode via an adhesive. A second detection electrode extends in the second direction at the outer side of the counter substrate.

19 Claims, 18 Drawing Sheets

DISPLAY DEVICE

CLAIM OF PRIORITY

The present application claims priority from Japanese Patent Application JP 2016-152758 filed on Aug. 3, 2016, the content of which is hereby incorporated by reference into this application.

BACKGROUND

The present invention relates to a display device, and more particularly, to a display section having a touch panel built in an organic EL display device.

Touching the surface of the display device with the user's finger has become common input process for the display device of the smart phone or the tablet. Generally, the touch panel is disposed on the display region. The liquid crystal display panel with built-in touch panel function has been developed for adaption to the liquid crystal display device.

Japanese Unexamined Patent Application Publication No. 2016-1233 discloses the liquid crystal display panel with built-in touch panel function. The disclosed liquid crystal display panel is configured to dispose one of electrodes of the touch panel at the outer side of the counter substrate, and to allow the common electrode inside the liquid crystal display panel to be used as the other electrode of the touch panel.

SUMMARY

The organic EL display device of self-luminous type is capable of generating the high contrast image. The device requires no backlight, which is advantageous in thinning the display device as a whole. Meanwhile, the use of the touch panel for the organic EL display device has also been demanded.

Mounting the touch panel onto the organic EL display device may increase its thickness by the amount corresponding to that of the touch panel, thus lessening the advantageous feature of the organic EL display device providing the thinning effect. The present invention provides the organic EL display device with built-in touch panel function.

The present invention has been made to overcome the aforementioned problem, which is configured as below.
(1) An organic EL display device includes a TFT substrate on which a scanning line extends in a first direction, a video signal line extends in a second direction, and a pixel having an anode, an organic EL layer and a cathode is formed on a region enclosed with the scanning line and the video signal line. A first electrode of a touch panel extends above the pixel in the first direction via an insulation film. A counter substrate is disposed while covering the first electrode of the touch panel. A second electrode of the touch panel extends in the second direction at an outer side of the counter substrate.
(2) According to the description (1), the second electrode is formed at the outer side of the counter substrate.
(3) According to the description (1), the second electrode is formed at the inner side of the counter substrate.

DETAILED DESCRIPTION

The present invention will be described in detail referring to embodiments.

First Embodiment

Figure 1:
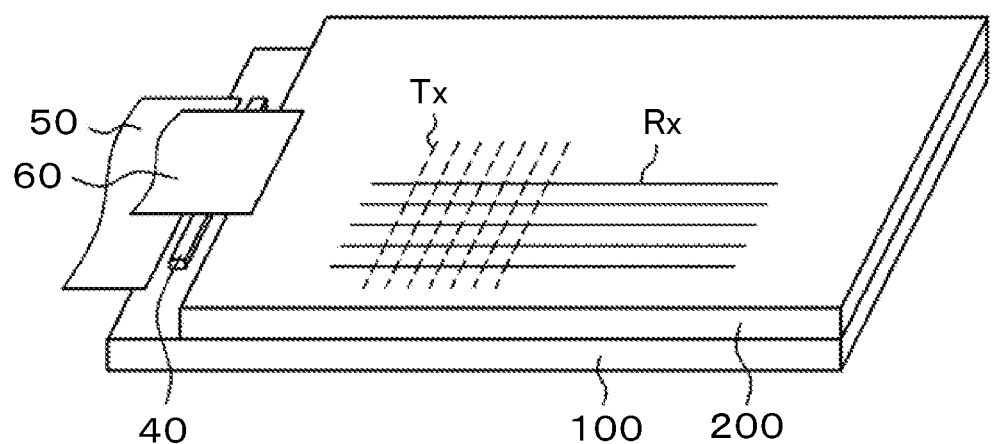
FIG. 1 is a perspective view of an organic EL display device.

FIG. 1 is a perspective view of an organic EL display device having built-in touch panel according to the present invention. Referring to FIG. 1, a counter substrate 200 is disposed on a TFT substrate 100 on which an organic EL device, a power source line, a scanning line, a video signal line and the like are formed. The counter substrate 200 is made of glass for protecting the organic EL device from external penetration of moisture. A flexible wiring substrate 60 for touch panel is connected to the counter substrate 200.

A driver IC 40 for driving the video signal line and the like is disposed on the TFT substrate 100, to which a flexible wiring substrate 50 is connected. The flexible wiring substrate 50 supplies power, video signals, clock signals and the like. As FIG. 1 shows, the code Rx denotes a touch panel detection electrode Y formed at the outer side of the counter substrate 200. The Rx may be formed at the inner side of the counter substrate. The code Tx denotes a touch panel detection electrode X formed on the TFT substrate 100. The Tx intersects the Rx in planar view. According to the present invention, the touch panel is built in the organic EL display device as shown in FIG. 1.

Figure 2:
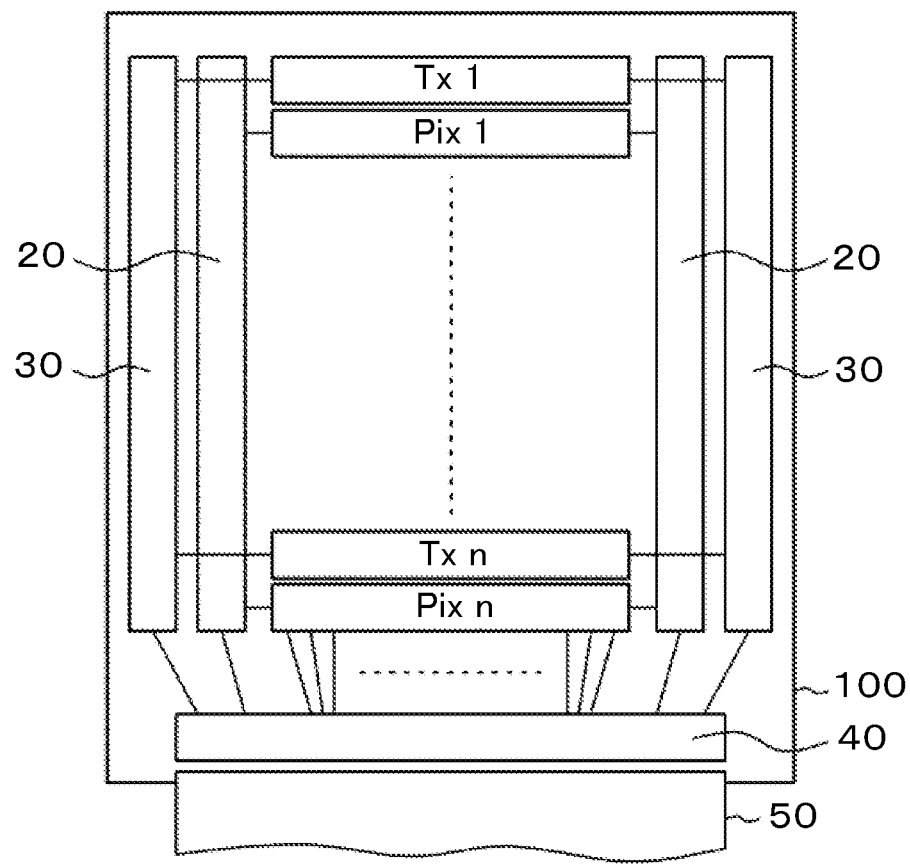
FIG. 2 is a plan view of a TFT substrate according to the present invention.

FIG. 2 is a plan view schematically showing the TFT substrate 100 of the organic EL display device. Referring to FIG. 2, scanning line drive circuits 20 are formed at both sides of the TFT substrate 100. Scanning lines from the scanning line drive circuits 20 extends transversely. Tx drive circuits 30 for driving the touch panel detection electrodes X (hereinafter referred to as detection electrode X or Tx) are disposed at the outer side of the respective scanning line drive circuits 20. The n transversely extending detection electrodes Tx are arranged in the longitudinal direction.

The driver IC 40 is disposed at the lower side as shown in FIG. 2, from which the video signal lines extend longitudinally. As shown in FIG. 2, the flexible wiring substrate 50 is connected to the TFT substrate 100. The flexible wiring substrate 50 supplies the video signals, the clock signals, power, and the like to the driver IC 40.

Pixels are arranged in a matrix on the TFT substrate 100. FIG. 2 represents the pixel array structure Pix having the pixels arranged in the same direction as the extending direction of the scanning line. In other words, each of the pixel arrays Pix may be collectively selected by the scanning line. The term "Pix 1 to Pix n" represents the array of n pixel rows. As FIG. 2 shows, the detection electrode X (Tx) receives a signal supplied from the Tx drive circuit. The term "Tx 1 to Tx n" represents the array of n Tx rows.

FIG. 2 shows that arrays of Tx and Pix arranged in parallel one another. Actually, however, those Tx and Pix are formed while being overlapped one another in planar view. FIG. 2 shows that the number of electrodes Tx is the same as that of the pixels Pix. However, those numbers do not necessarily have to be the same.

Figure 3:
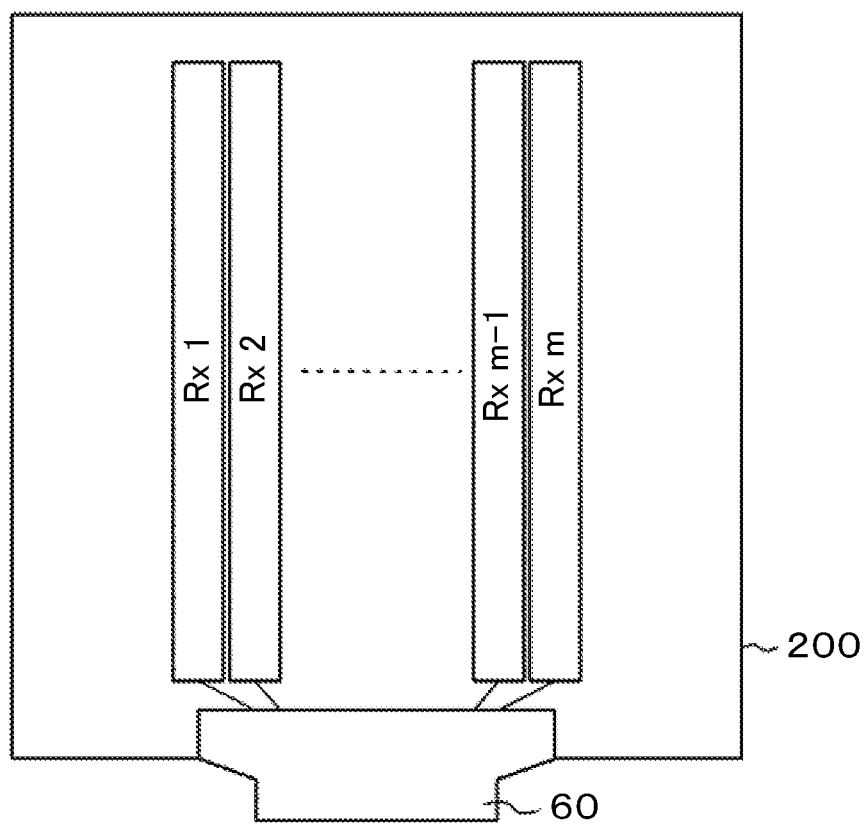
FIG. 3 is a plan view of a counter substrate according to the present invention.

FIG. 3 is a plan view of the counter substrate 200. Referring to FIG. 3, m longitudinally extending touch panel detection electrodes Y (hereinafter referred to as detection electrode Y or Rx) are arrayed in the transverse direction. The flexible wiring substrate 60 for touch panel supplies the signal for driving the Rx. The capacitance generated between the Tx as shown in FIG. 2 and the Rx as shown in FIG. 3 changes its value in response to touching on the screen with the user's finger. The touched position is detected by sensing the capacitance change.

Figure 4:
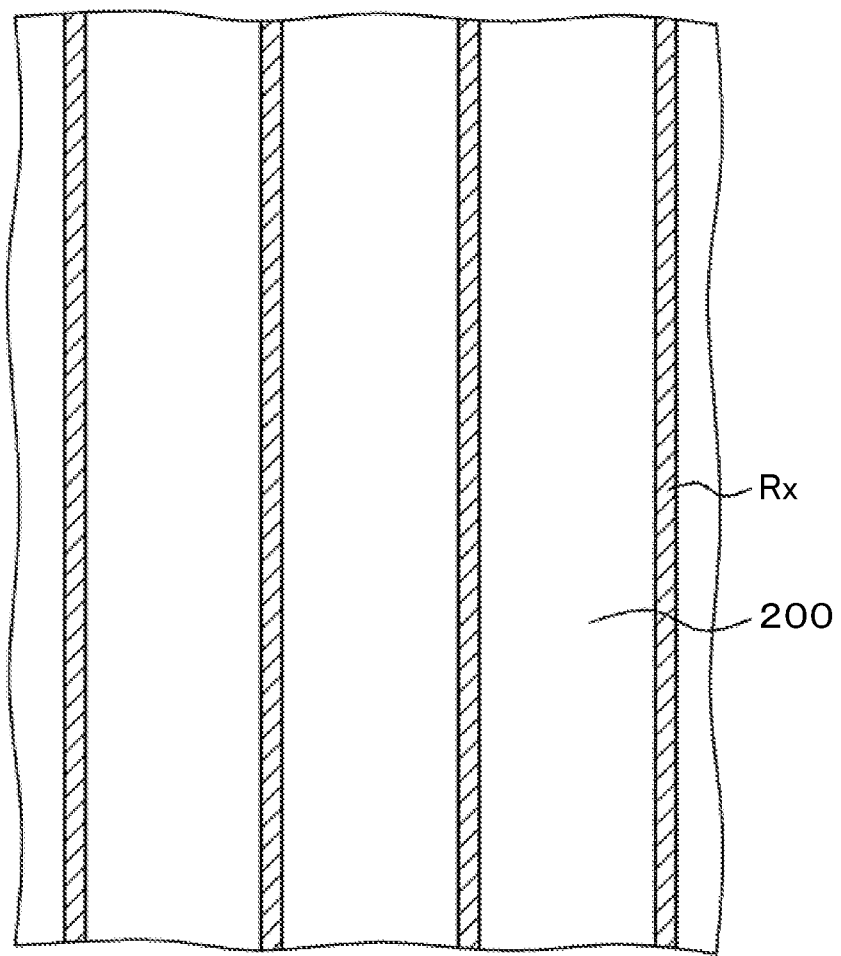
FIG. 4 is a plan view showing an example of a detection electrode Y (Rx)
Figure 5:
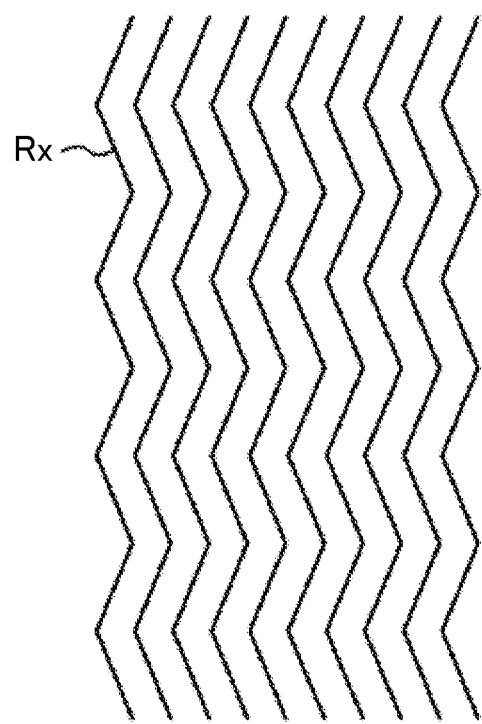
FIG. 5 is a plan view showing another example of the detection electrode Y (Rx)

FIG. 4 represents an example of the detection electrode Rx. As FIG. 4 shows, thin stripe-like electrodes Rx are arrayed at predetermined pitches on the counter substrate 200. The Rx is made of a transparent conductive film such as ITO (Indium Tin Oxide), ZnO (Zinc Oxide), or the metal film. The Rx does not have to be linearly formed. Specifically, in order to lessen moire caused by interference with the video signal lines and the power source lines formed on the TFT substrate 100, the planar shape of the Rx may be formed into the zigzag, or the wave-like shape as shown in FIG. 5. The extending direction of the Rx as shown in FIG. 4 is the same as the one as shown in FIG. 5.

Figure 6:
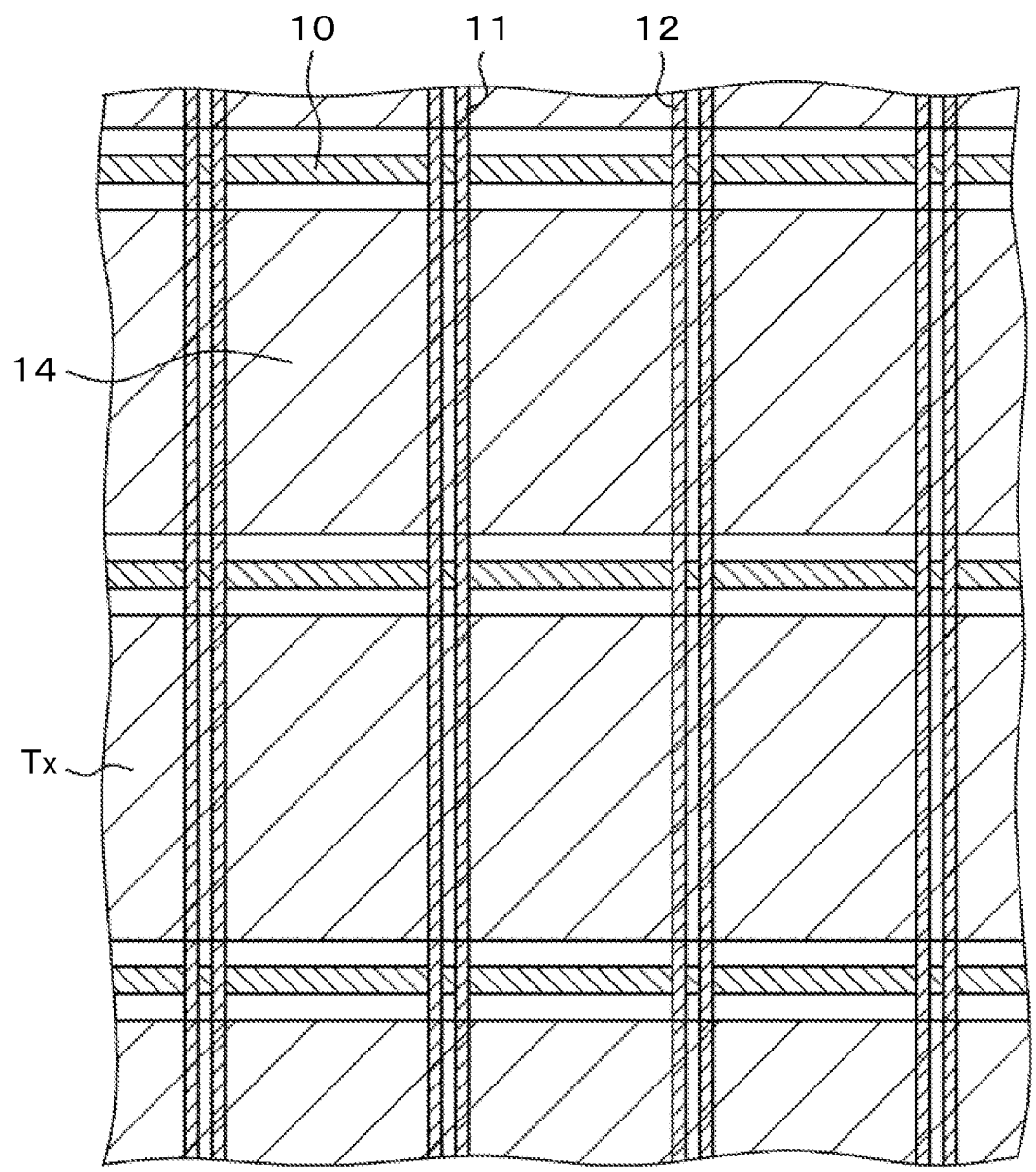
FIG. 6 is a plan view showing an example of a detection electrode X (Tx)

FIG. 6 is a plan view representing an example of the Tx. As FIG. 6 shows, the transversely extending scanning lines 10 are arrayed in the longitudinal direction. The longitudinally extending video signal lines 11 are arrayed in the transverse direction. The longitudinally extending power source lines 12 parallel to the video signal lines 11 are arrayed in the transverse direction. The pixel is formed on the region enclosed with the video signal line 11, the power source line 12, and the scanning line 10. In other words, a pixel 14 exists as the region enclosed with the scanning line 10 and the video signal line 11. The Tx is formed as the part overlapped with the pixel in planar view. The Tx transversely extends between the scanning lines 10 to constitute the detection electrode X. The Tx is made of the transparent conductive film such as ITO (Indium Tin Oxide) and ZnO (Zinc Oxide), or the metal film.

Figure 7:
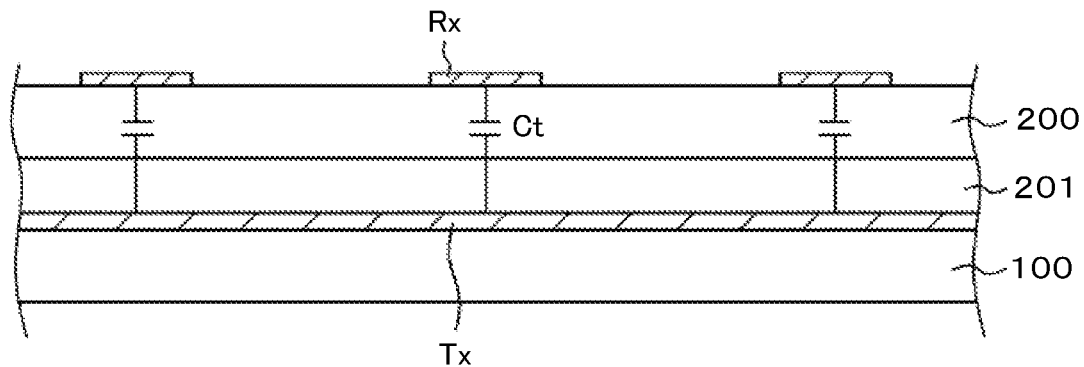
FIG. 7 is a sectional view representing the principle of a touch panel of electrostatic capacity type.

FIG. 7 is a sectional view representing the principles of electrostatic type touch panel according to the present invention. As FIG. 7 shows, the Tx transversely extends on the TFT substrate 100. The counter substrate 200 is disposed on the TFT substrate 100 via an adhesive 201. The electrodes Rx which extend on the counter substrate 200 in the direction orthogonal to the drawing are arrayed at predetermined pitches. As FIG. 7 shows, the capacitance Ct is generated at the intersection area between the Rx as shown in FIG. 4 and the Tx as shown in FIG. 6. The capacitance Ct changes its value in response to touching on the screen by the user's finger. The touched position is detected by sensing the capacitance change.

Figure 8:
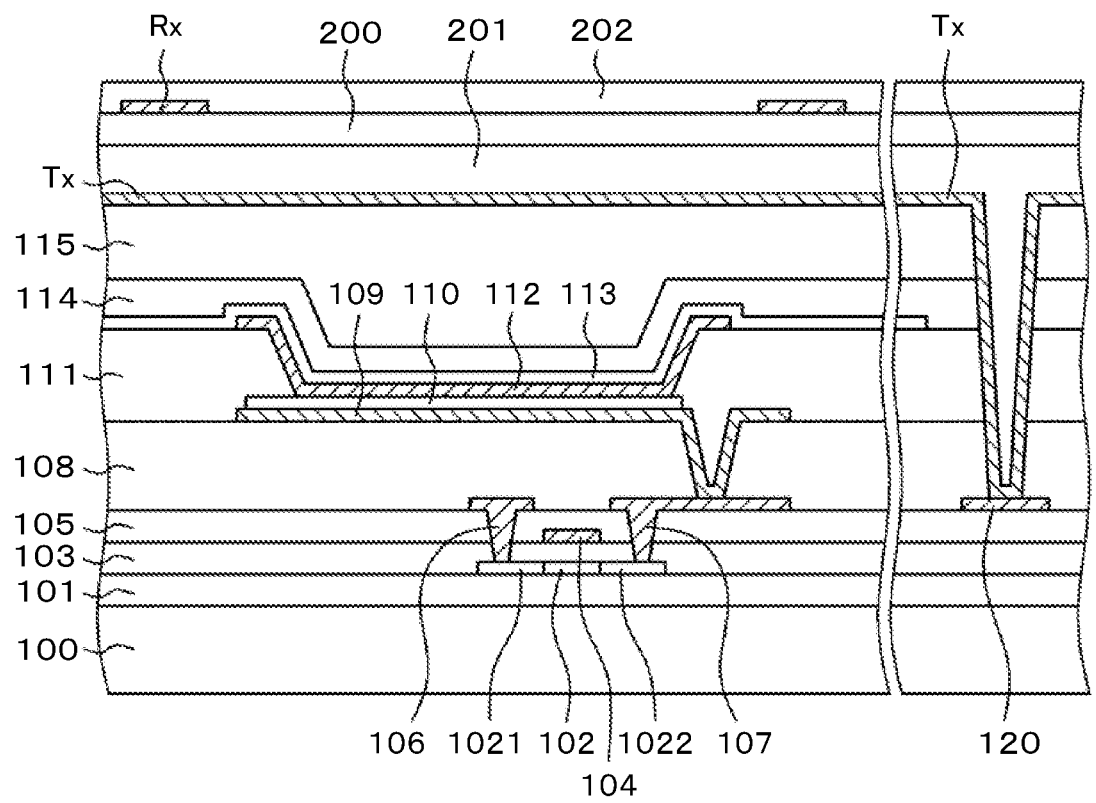
FIG. 8 is a sectional view of a structure according to a first embodiment.

FIG. 8 is a sectional view of the organic EL display device. The left part of FIG. 8 is the sectional view of the pixel part, and the right part is the sectional view of the part for supplying the signal to the Tx. As FIG. 8 shows, the TFT substrate 100 is made of such resin as polyimide, polyethylene telephthalate, and polyethylene naphthalate. Especially, the use of polyimide is preferable as it exhibits excellent properties of mechanical strength and thermal resistance. The thickness of the TFT substrate 100 ranges from 10 μm to 20 μm, serving as the flexible substrate. It is very difficult to subject the above-described thin substrate to the manufacturing process. Therefore, as described later, the TFT substrate 100 made of resin is formed on the glass substrate. The glass substrate will be removed later.

A base film 101 is formed on the TFT substrate 100. The base film 101 is made of the laminated film, for example, SiO film, SiN film, and the like so as to prevent impurities from the TFT substrate 100 from contaminating a semiconductor layer 102. For the purpose of ensuring barrier property against penetration of moisture, the aluminium oxide (AlO) film may be prepared as the base film.

The term AB (for example, SiO) as described herein represents the compound having constituent elements A and B. However, it does not mean that each element has the same composition ratio. The basic composition ratio is specified, but there may often be the case that such ratio deviates from the value of the basic composition ratio, in general, depending on manufacturing conditions.

The semiconductor layer 102 constituting the TFT (Thin Film Transistor) is formed on the base film 101. Initially, the semiconductor layer 102 is formed by producing a-Si (amorphous silicon) through CVD, and then converting the a-Si into Poly-Si (polycrystal silicon) through excimer laser. A gate insulation film 103 is formed by using SiO made from TEOS (Tetraethyl orthosilicate), which covers the semiconductor layer 102. Then a gate electrode 104 is formed on the gate insulation film 103. Thereafter, ion implantation of phosphorus or boron is conducted so that conductivity is imparted to the part of the semiconductor layer 102, which is not covered with the gate electrode 104 for forming a drain 1021 and a source 1022.

An interlayer insulation film 105 is formed from SiN while covering the gate electrode 104. A through hole is formed in the interlayer insulation film 105 and the gate insulation film 103 for connection of a drain electrode 106 and a source electrode 107. An organic passivation film 108 is formed while covering the drain electrode 106 and the source electrode 107. As the material for forming the organic passivation film 108, polyimide, acryl and the like may be used. The organic passivation film 108 is made of a photosensitive resin. The exposed portion of the photosensitive resin dissolves in developing fluid so that the through hole is made without using the resist.

Then a reflection electrode 109 is formed on the organic passivation film 108. The reflection electrode 109 is connected to the source electrode 107 via the through hole formed in the organic passivation film 108. The reflection electrode 109 is made of an Al alloy.

An anode 110 is formed on the reflection electrode 109 through ITO. Then a bank 111 is formed from an organic material such as acryl. The bank 111 serves to prevent step-out of an organic EL layer 112 to be formed later. Alternatively, the bank may serve as the partition between the respective pixels. The organic EL layer 112 is applied to the inside of the through hole formed in the bank 111. The organic EL layer 112 is constituted by a plurality of layers including a hole injection layer, hole transport layer, luminous layer, electron transport layer, electron injection layer, and the like.

A cathode 113 is made of the transparent conductive film selected from any one of ITO, IZO (Indium Zinc Oxide), and AZO (Antimony Zinc Oxide). The cathode 113 is applied onto the entire surface of the display region. The cathode may be made of the metal thin film. The material for forming the cathode may be determined depending on the balance between the light transmittance and electric resistance.

A protective film 114 is formed from SiN, SiO, and the like through CVD while covering the cathode 113. The AlO film may be formed to further ensure the barrier property. The AlO film is formed through sputtering. That is, the protective film may be formed as the laminated film constituted by SiN, SiO, and AlO.

As FIG. 8 shows, a flattening film 115 made of polyimide or acryl is applied onto the protective film. The touch panel detection electrode X (Tx) is formed on the flattening film 115. The Tx may be made of the transparent conductive film such as ITO and ZnO, or the metal film.

Referring to the right part of FIG. 8, the Tx extends to the periphery of the display region, and is connected to a Tx wiring 120 at the periphery via the through hole. The Tx wiring 120 is formed as the layer corresponding to those of the drain electrode 106, the source electrode 107, and the video signal line 11, and made of the same material as the one for forming those elements. A signal for Tx is supplied via the Tx wiring 120. The TFT substrate 100, thus, is completed.

Referring to FIG. 8, the counter substrate 200 on which the touch panel detection electrode Y (Rx) is formed is bonded via the adhesive 201. The counter substrate 200 is made of glass, and has thickness ranging from 20 µm to 150 µm. The touch panel detection electrodes Y (Rx) at the outer side of the counter substrate 200 are arranged at predetermined pitches, and extend in the direction orthogonal to the drawing.

The pitch of the Rx may be determined in accordance with resolution of the touch panel. Therefore, the pitch does not have to be finely set as shown in FIG. 8. An overcoat film 202 made of resin such as acryl and epoxy is formed to cover the Rx for protective purpose. If humidity resistance is demanded, the overcoat film 202 may be made of the inorganic film such as SiO. The overcoat film 202 may be formed into the laminated structure constituted by the inorganic film and the organic film.

The overcoat film 202 is formed while being kept away from the terminal part of the counter substrate 200. The flexible wiring substrate 60 for touch panel is connected to the terminal part of the counter substrate 200, and outputs Rx signals. The touched position is detected by sensing change in the detection capacitance Ct formed between the Rx and Tx as shown in FIG. 8.

The structure as shown in FIG. 8 is configured to have the counter substrate 200 made of glass, exhibiting significantly excellent property as the protective film for protecting the organic EL layer from penetration of moisture. Referring to the structure as shown in FIG. 8, the counter substrate made of glass has its thickness ranging from 20 µm to 150 µm, which allows the organic EL display device to be formed into remarkably thin structure as a whole. This makes it possible to impart flexibility to the organic EL display device.

Figure 9:
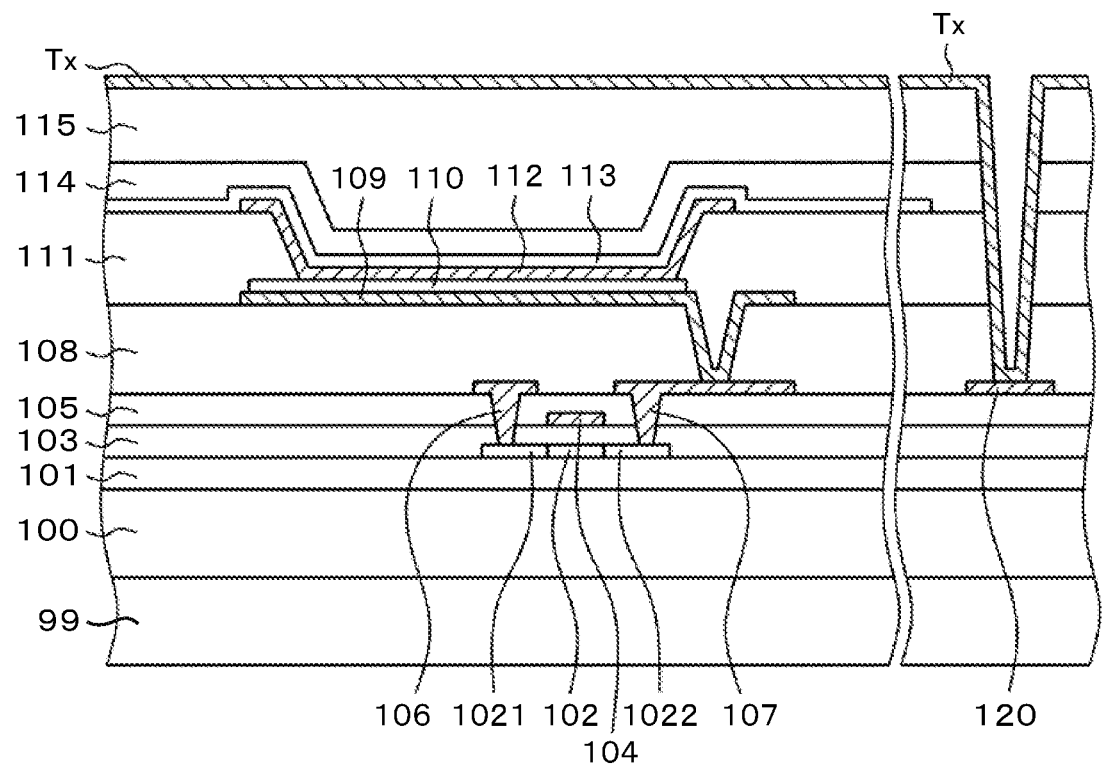
FIG. 9 is a sectional view of a TFT substrate according to the first embodiment.

FIGS. 9 to 12 are sectional views representing the process of forming the organic EL display device with built-in touch panel according to a first embodiment. FIG. 9 shows the completed TFT substrate 100. Specifically, the detection electrode X (Tx) is formed on the flattening film made of polyimide or acryl. The Tx is connected to the Tx wiring via the through hole formed in the flattening film 115, the protective film 114, the bank 111, and the organic passivation film 108.

Figure 10:
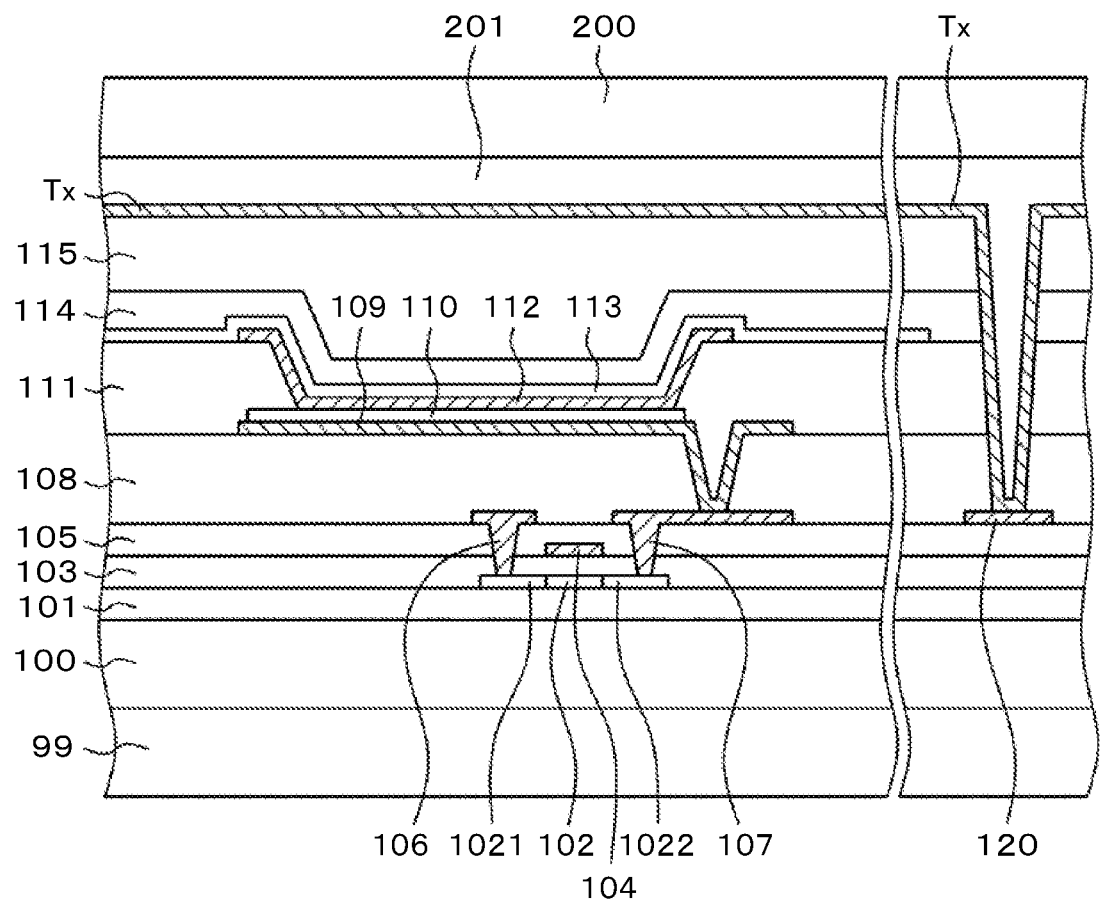
FIG. 10 is a sectional view representing the state that the counter substrate is bonded to the TFT substrate.

FIG. 10 shows the state that the glass substrate to be formed as the counter substrate 200 is bonded to the TFT substrate 100 via the adhesive 201. Referring to the state as shown in FIG. 10, the TFT substrate 100 made of resin such as polyimide is formed on a glass substrate 99. In the state as shown in FIG. 10, the glass substrate to be formed as the counter substrate 200 is readily available on the market. The glass substrate has its thickness of approximately 0.5 mm, which may be easily handled.

Figure 11:
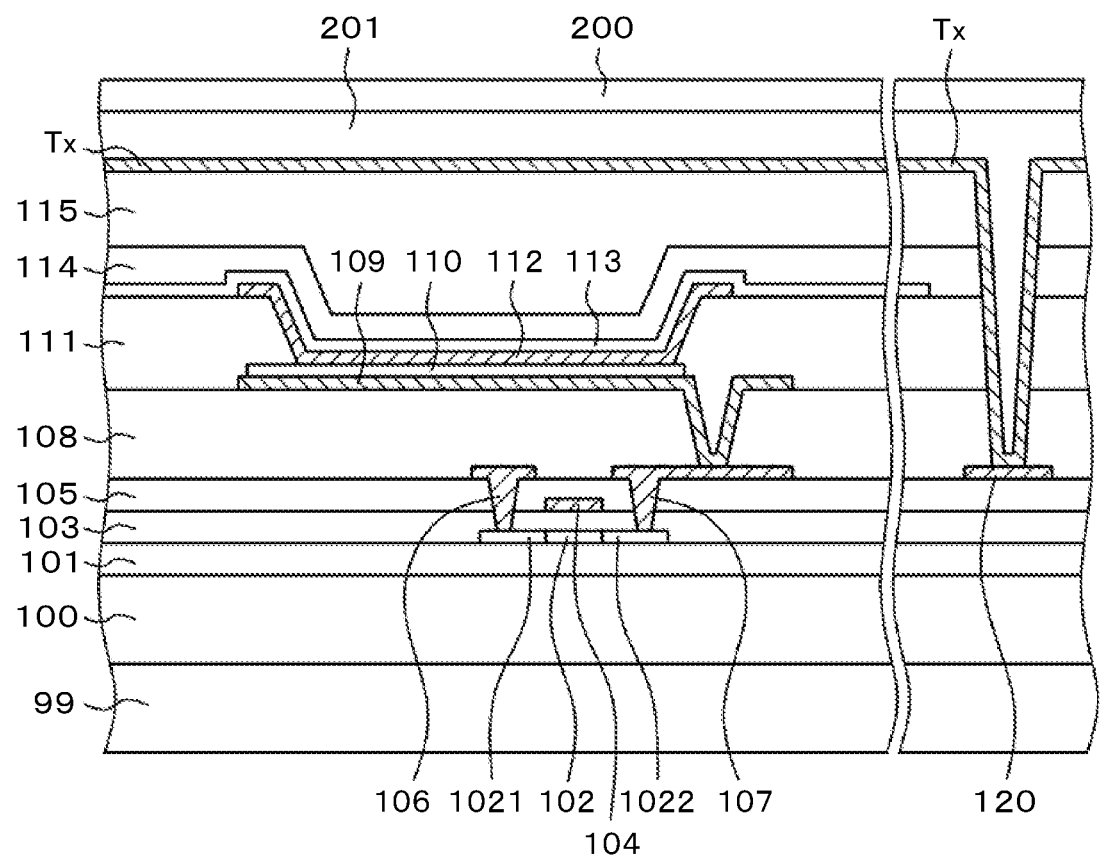
FIG. 11 is a sectional view representing the state that the counter substrate is thinned through polishing.

Then the glass substrate to be formed as the counter substrate 200 is polished through the mechanical-chemical polishing process for thinning to have the thickness ranging from 20 µm to 150 µm as FIG. 11 shows.

Figure 12:
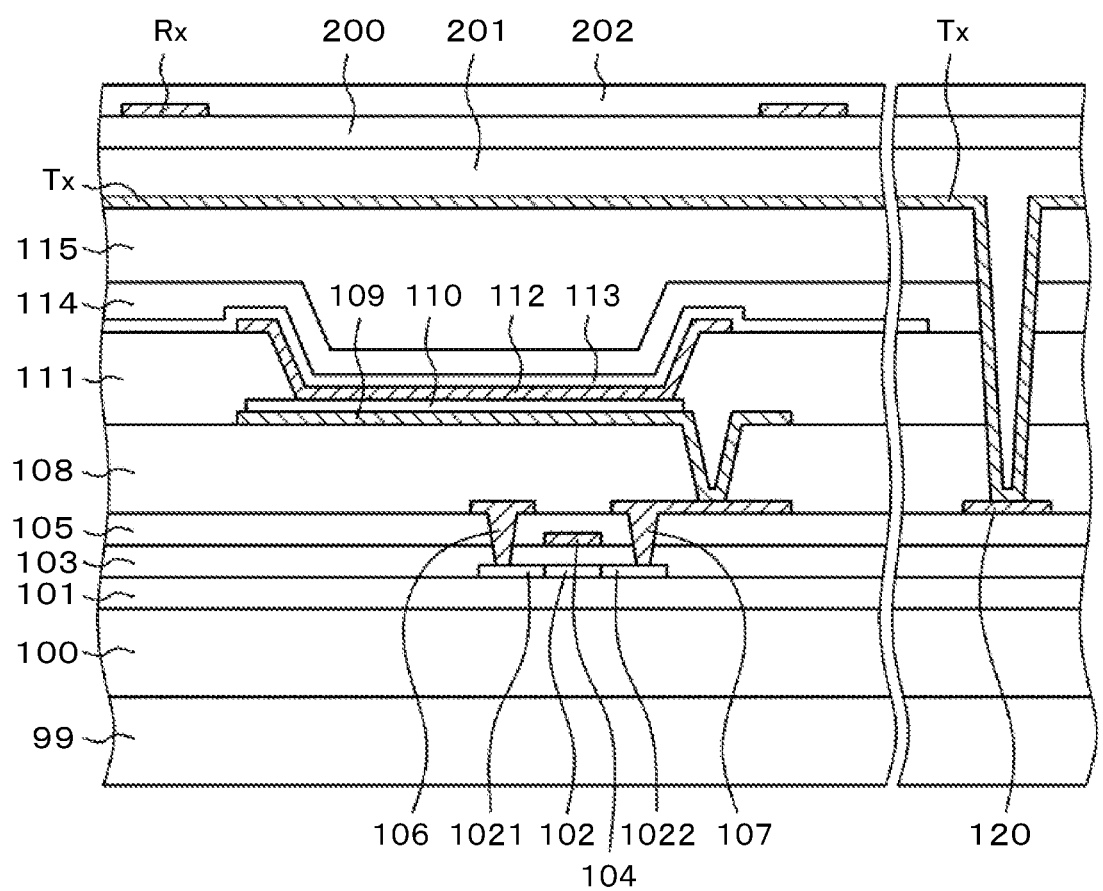
FIG. 12 is a sectional view representing the state that an overcoat film is applied to cover the detection electrode Y (Rx) formed on the polished counter substrate.

Thereafter, as FIG. 12 shows, the detection electrode Y (Rx) is formed on the thus thinned counter substrate 200. The Rx is formed of the transparent conductive film such as ITO and ZnO, or the metal film. The Rx is covered with the overcoat film 202 made of such resin as epoxy and acryl, or such inorganic film as SiO and SiN for the protective purpose.

Then, the glass substrate 99 is separated from the TFT substrate 100 made of resin through the laser abrasion process, resulting in the organic EL display device with built-in touch panel as shown in FIG. 8. This makes it possible to actualize the organic EL display device with built-in touch panel, which is thin sufficient to impart flexibility to the device.

Figure 13:
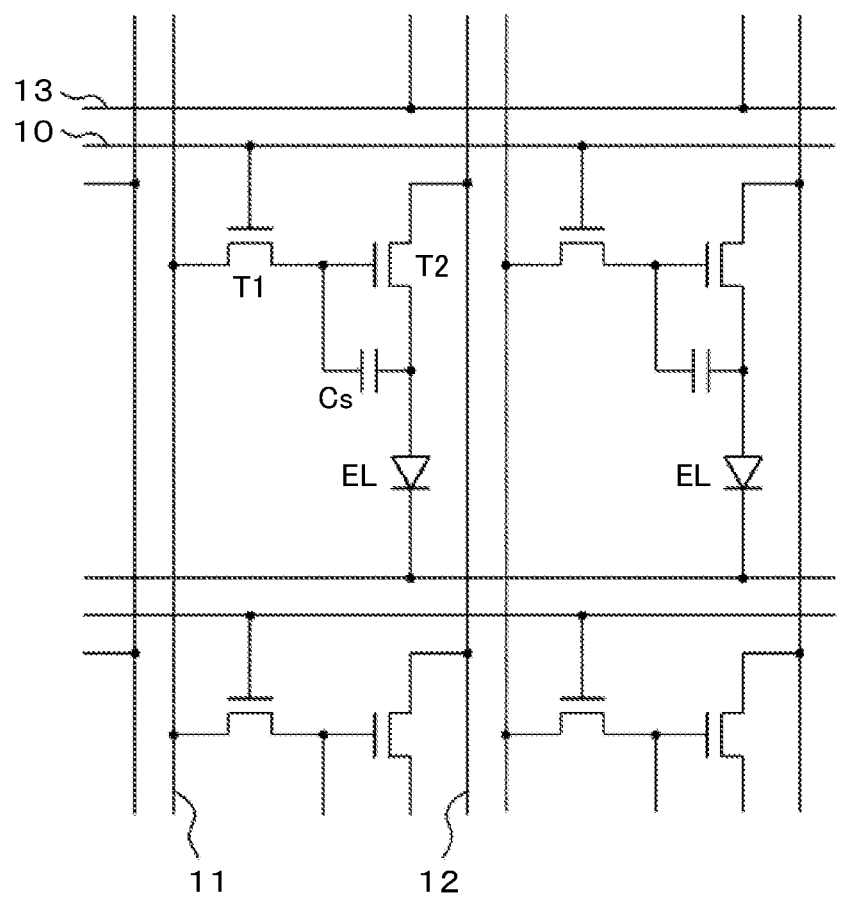
FIG. 13 is an equivalent circuit diagram of a pixel.

FIG. 13 shows an equivalent circuit diagram of the pixel structure. Referring to FIG. 13, the pixel is formed on the region enclosed with the scanning line 10, the video signal line 11, and the power source line 12. In the pixel, an organic EL element EL formed of the organic EL layer 112 is connected to a drive TFT (T2) for driving the organic EL element EL in series. A storage capacitance Cs is positioned between the gate and the drain of the drive TFT (T2). The current is applied from the drive TFT (T2) to the EL in accordance with potential of the storage capacitance Cs.

As FIG. 13 shows, the scanning line 10 is connected to the gate of the selected TFT (T1). The T1 is opened or closed in accordance with the ON or OFF signal of the scanning line 10. When the T1 is turned ON, the video signal is supplied from the video signal line 11 so that charge is accumulated in the storage capacitance Cs by the video signal. The potential of the storage capacitance Cs serves to drive the drive TFT (T2) so that the current is applied to the organic EL (EL).

Figure 14:
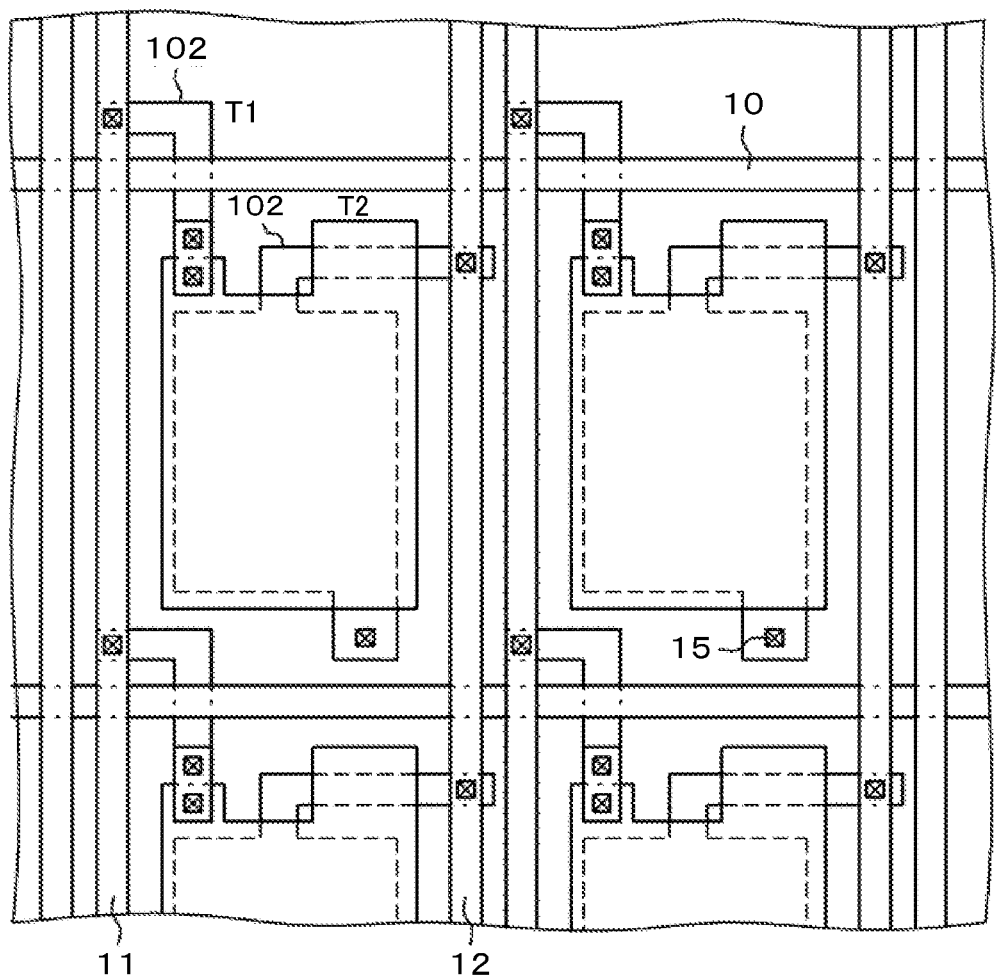
FIG. 14 is a plan view representing a pixel layer structure corresponding to FIG. 13.

FIG. 14 is a plan view of the pixel part corresponding to the circuit as shown in FIG. 13. Referring to FIG. 14, the scanning lines 10 extend transversely. The video signal lines 11 and the power source lines 12 longitudinally extend, respectively. The pixel is formed on the region enclosed with the scanning line 10, the video signal line 11, and the power source line 12. In other words, the pixel may be the region enclosed with the scanning line 10 and the video signal line 11. The selected TFT (T1) is formed at a part where the semiconductor layer 102 connected to the video signal line 11 intersects the scanning line 10.

The drive TFT (T2) is formed at a part where the semiconductor layer 102 connected to the power source line 12 intersects one of electrodes constituting the storage capacitance Cs. The other electrode of the storage capacitance Cs, that is, the semiconductor layer to which conductivity is imparted is connected to the anode in a through hole 15. FIG. 14 does not show the cathode which is formed over all the surfaces of the pixels.

Figure 15:
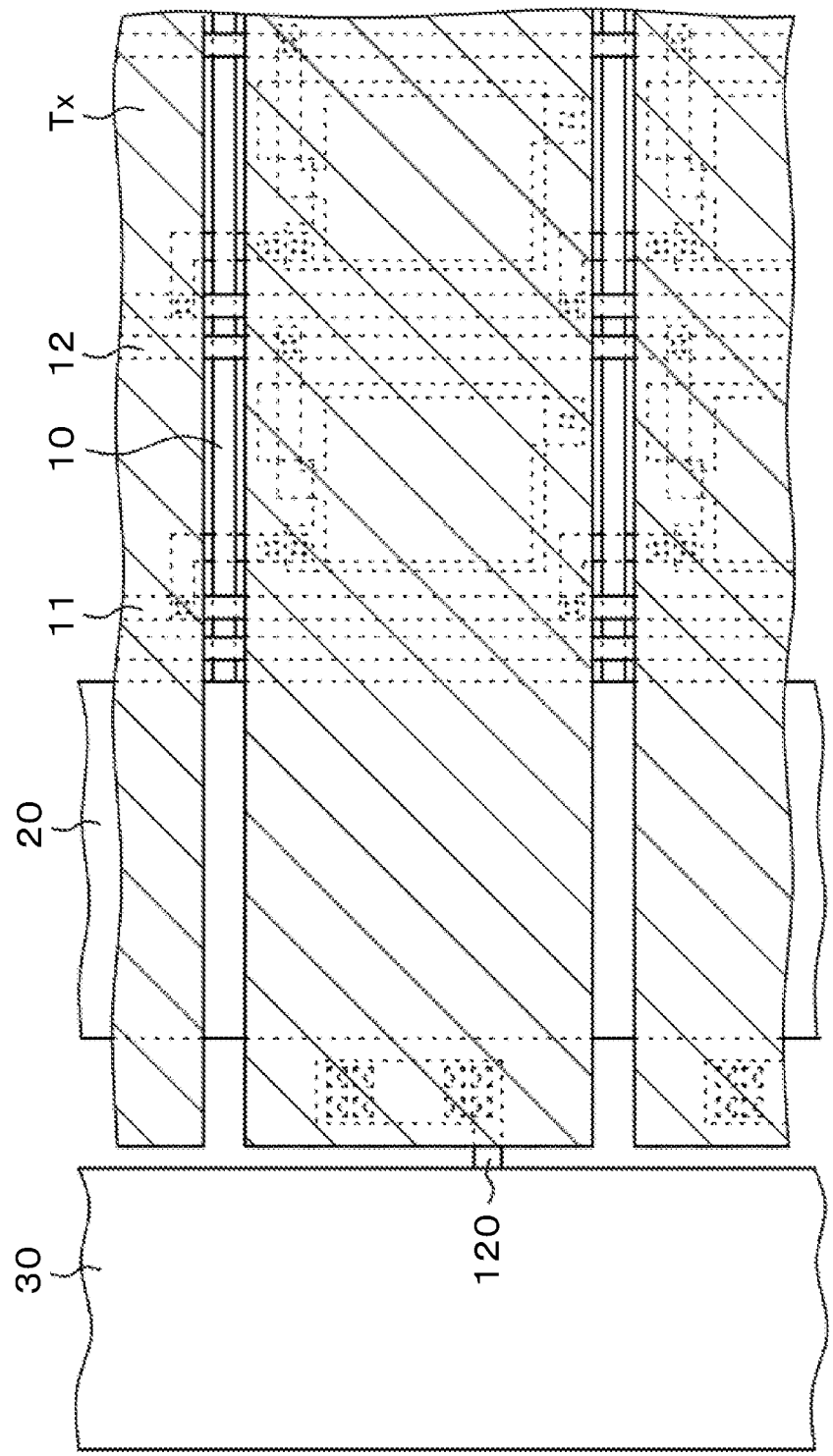
FIG. 15 is a plan view representing a first example of the detection electrode X (Tx)

FIG. 15 is a plan view showing the state that the detection electrode X (Tx) transversely extends while covering the respective pixels. Referring to FIG. 15, the Tx drive circuit 30 located at the left side of the drawing supplies detection signals to the detection electrode X (Tx) via the Tx wiring 120. The Tx extends rightward while covering the pixels in planar view. The scanning line drive circuit 20 located closer to the display region than the Tx drive circuit 30 extend longitudinally.

As FIG. 15 shows, the Tx is formed corresponding to each of the respective pixel arrays. However, it does not have to be formed for each of the pixel arrays. It is possible to form the Tx for every two pixel arrays or more because the touch panel resolution is not considered as necessary as the video resolution.

Figure 16:
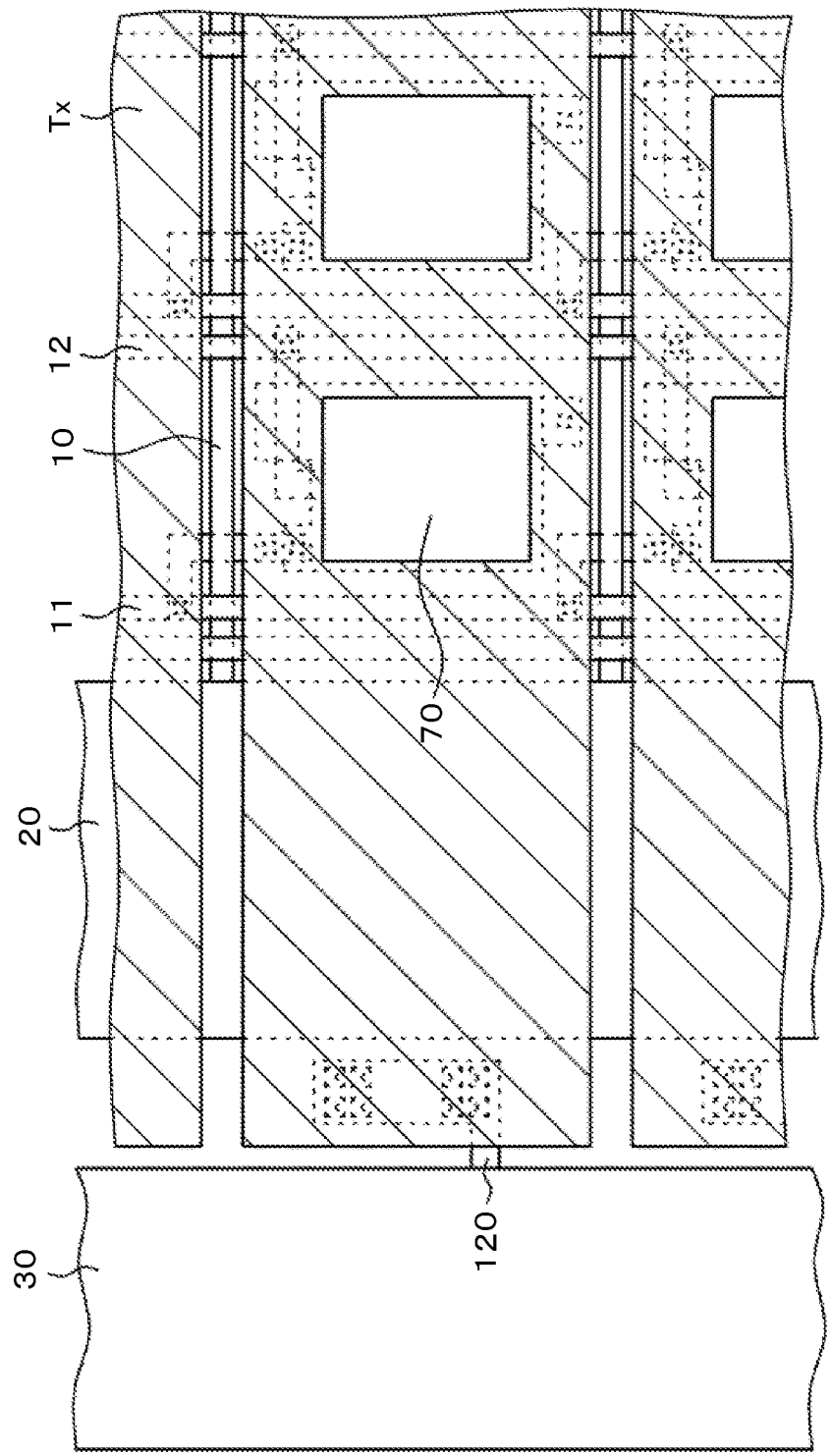
FIG. 16 is a plan view representing a second example of the detection electrode X (Tx)

FIG. 16 shows an opening 70 that is formed in the Tx as a Tx-free region. In other words, the Tx is made of the conductive transparent electrode or the metal thin film, which may deteriorate transmittance to a slight degree. In order to prevent such deterioration, the opening 70 is formed in the pixel at the region where light is actually emitted so as to prevent the luminance deterioration owing to the Tx.

Second Embodiment

Figure 17:
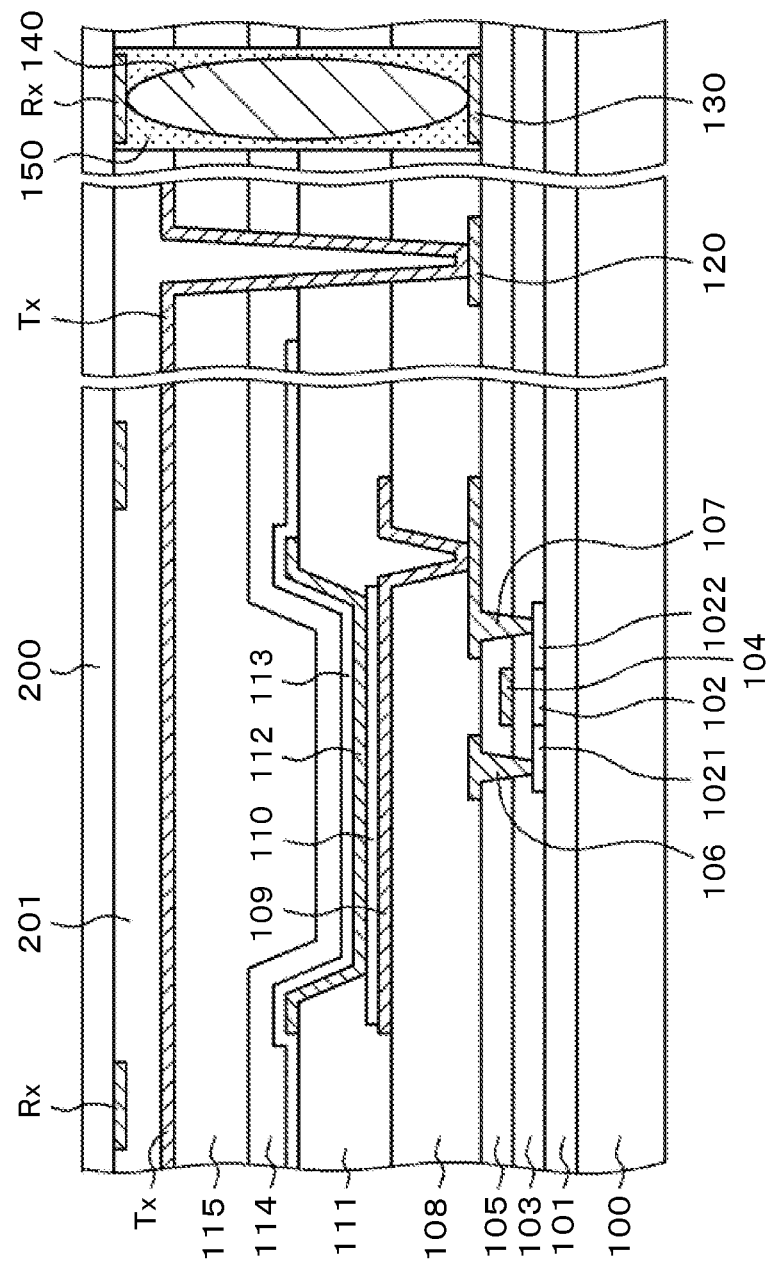
FIG. 17 is a sectional view representing a structure according to a second embodiment.

FIG. 17 is a sectional view of a second embodiment according to the present invention. FIG. 17 shows the feature of the detection electrode Y (Rx) formed at the inner side of the counter substrate 200. In other words, the counter substrate 200 having the detection electrodes Y (Rx) formed at the inner side is bonded to the flattening film 115 and the detection electrode X (Tx) of the TFT substrate 100 via the adhesive 201.

The structure as shown in FIG. 17 has the Rx formed at the inner side of the counter substrate 200. Therefore, the distance between the Rx and Tx is reduced, allowing increase in the capacitance. This makes it possible to improve the touch panel sensitivity. Furthermore, as the Rx is formed at the inner side of the counter substrate 200, the overcoat film for protecting the Rx is no longer necessary.

Furthermore, the Rx formed at the inner side of the counter substrate 200 does not have to be connected to the flexible wiring substrate for touch panel. In other words, as FIG. 17 shows, the through hole is formed in the flattening film 115, the protective film 114, the bank 111, the organic passivation film 108 and the like at the region around the substrate so as to generate a conductive paste 150 with a conductive particle 140 in the through hole. This makes it possible to supply the signal from the TFT substrate 100 to the Rx via an Rx wiring 130.

FIG. 17 shows cross section of the conductive particle 140, which is formed into a vertically long elliptic shape. It is schematically shown, and actually, the conductive particle 140 is spherical, or formed by laminating a plurality of spherical conductive particles. The resin medium of the conductive paste 150 is formed by using epoxy resin. Any other structures of the TFT substrate 100 as shown in FIG. 17 are similar to those shown in FIG. 8.

Figure 18:
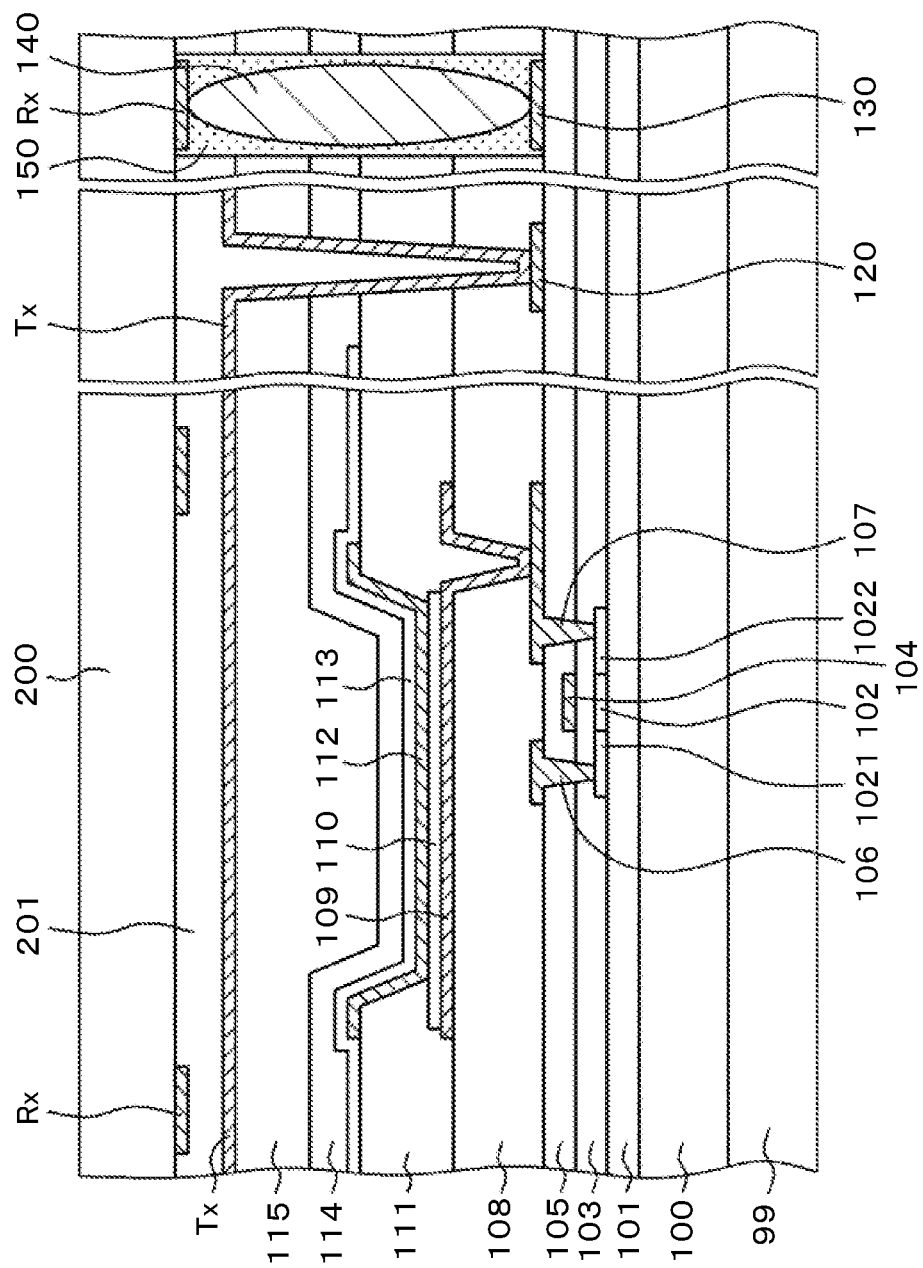
FIG. 18 is a sectional view representing the state that the counter substrate is disposed according to the second embodiment.
Figure 19:
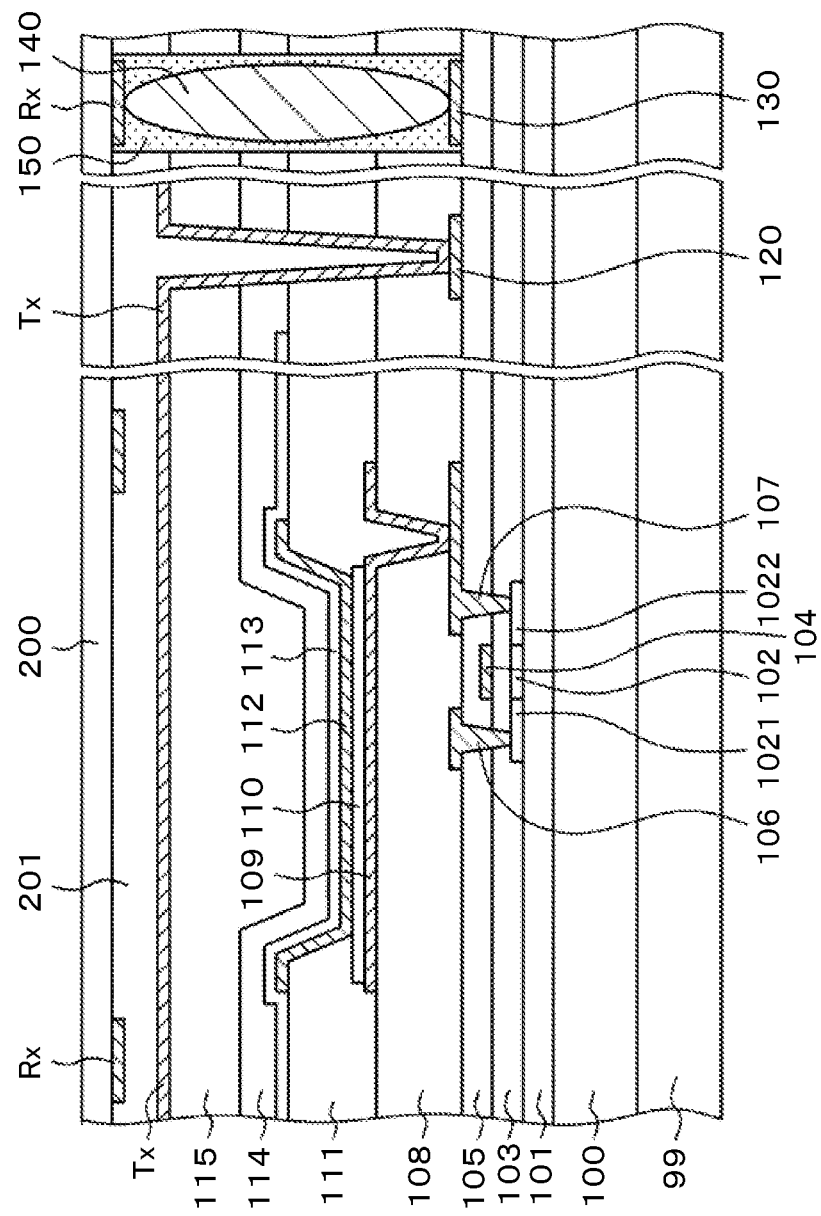
FIG. 19 is a sectional view representing the state that the counter substrate is thinned through polishing.

FIGS. 18 and 19 are sectional views showing the process of manufacturing the organic EL display device with built-in touch panel as shown in FIG. 17. FIG. 18 is a sectional view representing the state that the counter substrate 200 having the Rx formed at its inner side is bonded to the TFT substrate 100 with the adhesive 201. The aforementioned state shows sufficient strength because of the thickness of the counter substrate 200 set to approximately 0.5 mm. This makes it possible to allow execution of the Rx-forming process.

Unlike the first embodiment, this embodiment has an advantage that allows bonding of the counter substrate having the Rx formed thereon to the TFT substrate. In the state as shown in FIG. 18, the TFT substrate 100 made of resin is disposed on the glass substrate 99.

FIG. 19 is a sectional view representing the state that the counter substrate is thinned to have the thickness ranging from 20 μm to 150 μm through the mechanical-chemical polishing process. FIG. 19 shows the state that the TFT substrate 100 is still placed on the glass substrate 99. Thereafter, the TFT substrate 100 made of resin is separated from the glass substrate 99 through the laser abrasion process, resulting in the organic EL display device with built-in touch panel as shown in FIG. 17.

Third Embodiment

Figure 20:
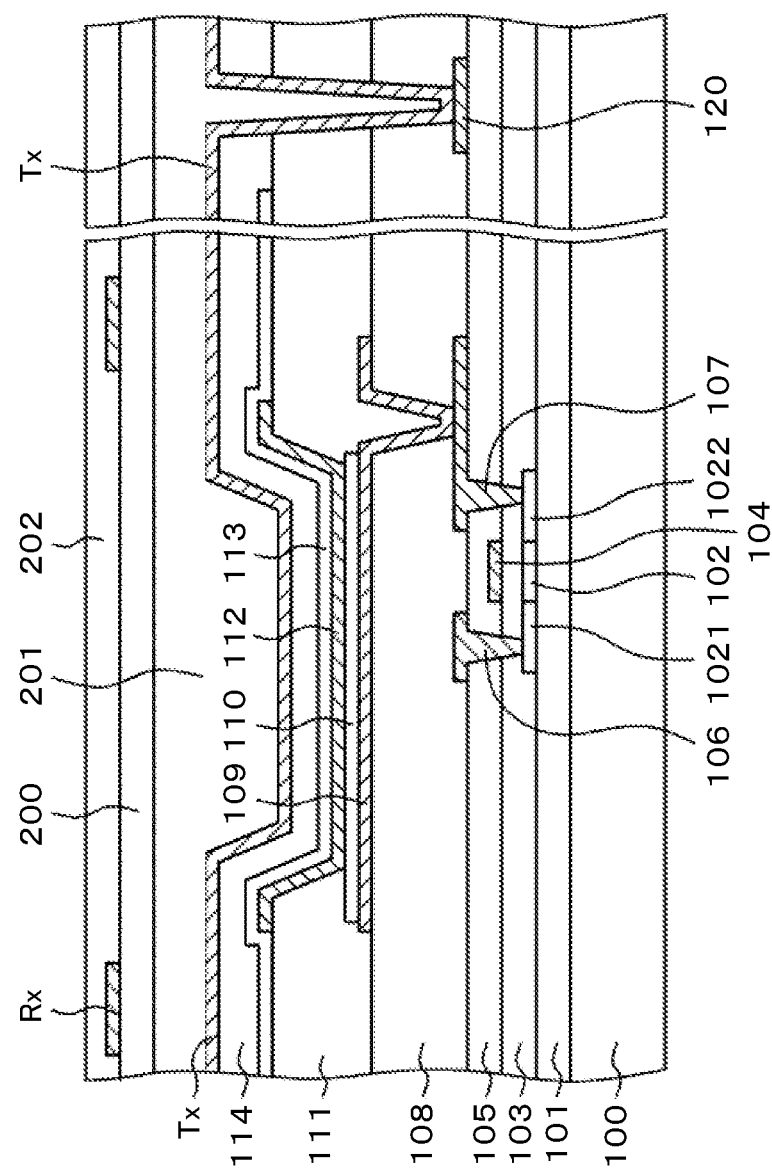
FIG. 20 is a sectional view representing the structure according to a third embodiment.

FIG. 20 is a sectional view of a third embodiment of the organic EL display device according to the present invention. The structure as shown in FIG. 20 is different from the one according to the first embodiment as shown in FIG. 8 in that there is no flattening film between the detection electrode X (Tx) and the counter substrate 200. The absence of the flattening film contributes to direct formation of the detection electrode X (Tx) on the protective film 114. A large stepped portion on the protective film surface may cause the problem of disconnection of the detection electrode X (Tx).

Any one of the SiN film, the SiO film, the AlO film, or the laminated film thereof may be used for forming the protective film 114. The concavo-convex surface of the protective film 114 is influenced by the film thickness, or the film forming process such as CVD and sputtering.

Therefore, the employment of the flattening film 115 may be determined depending on the surface shape of the protective film 114, and the planar shape of the Tx. Specifically, whether or not the flattening film is employed may be determined in consideration of the shape which is unlikely to cause disconnection as shown in FIG. 15, or in consideration of the shape having emphasis placing on brightness as shown in FIG. 16.

FIG. 20 schematically shows that the side wall of the through hole for connection of the Tx and the Tx wiring 120 is steeply tapered. Actually, the side wall of the through hole may be tapered far gentler than the one as shown in the drawing. As the through hole for connection of the Tx and the Tx wiring 120 may be formed outside the display region, the through hole may be formed in the region with relatively large area.

FIG. 20 shows the structure applied to the cross sectional shape according to the first embodiment. It is also possible to apply the structure to the cross sectional shape according to the second embodiment.

Even the above explanation has been described with respect to the TFT which employs Poly-Si, it is possible to employ the oxide semiconductor such as IGZO (Indium Gallium Zinc Oxide) for the TFT. In the above description, the TFT of top gate type has been explained as an example. It is also possible to use the TFT of bottom gate type as well.

What is claimed is:

1. An organic EL display device comprising:
    a TFT substrate on which a scanning line extends in a first direction, a video signal line extends in a second direction, and a pixel are provided, wherein
    the pixel is formed in a region enclosed with the scanning line and the video signal line;
    the pixel includes an anode, an organic EL layer and a cathode;
    a first electrode of a touch panel extends above the pixel in the first direction via an insulation film;
    the first electrode is connected to a first wiring formed as the layer corresponding to the video signal line via a first through hole;
    a counter substrate is disposed while covering the first electrode of the touch panel; and
    a second electrode of the touch panel extends in the second direction at an outer side of the counter substrate.

2. The organic EL display device according to claim 1, wherein the first electrode of the touch panel extends between the scanning lines in the first direction in planar view.

3. The organic EL display device according to claim 2, wherein the first electrode of the touch panel has an opening formed in a part corresponding to the organic EL layer.

4. The organic EL display device according to claim 1, wherein the first electrode of the touch panel is formed on a flattening film which covers a protective film made of an inorganic insulation film for covering the cathode.

5. The organic EL display device according to claim 1, wherein the first electrode of the touch panel is formed on a protective film made of an inorganic insulation film for covering the cathode.

6. The organic EL display device according to claim 1, wherein the second electrode of the touch panel is covered with an overcoat film.

7. The organic EL display device according to claim 6, wherein the overcoat film is made of a resin.

8. The organic EL display device according to claim 6, wherein the overcoat film is made of an organic film.

9. The organic EL display device according to claim 1, wherein the TFT substrate is made of polyimide.

10. The organic EL display device according to claim 1, wherein the counter substrate is made of glass.

11. An organic EL display device comprising:
    a TFT substrate on which a scanning line extends in a first direction, a video signal line extends in a second direction, and a pixel are provided, wherein
    the pixel is formed in a region enclosed with the scanning line and the video signal line;
    the pixel includes an anode, an organic EL layer and a cathode;
    a first electrode of a touch panel extends above the pixel in the first direction via an insulation film;
    a counter substrate is disposed while covering the first electrode of the touch panel;
    a second electrode of the touch panel extends in the second direction at an inner side of the counter substrate; and
    the second electrode is connected to a second wiring formed as the layer corresponding to the video signal line via a second through hole.

12. The organic EL display device according to claim 11, wherein the first electrode of the touch panel extends between the scanning lines in the first direction in planar view.

13. The organic EL display device according to claim 11, wherein the first electrode of the touch panel has an opening formed in a part corresponding to the organic EL layer.

14. The organic EL display device according to claim 11, wherein the first electrode of the touch panel is formed on a flattening film which covers a protective film made of an inorganic insulation film for covering the cathode.

15. The organic EL display device according to claim 11, wherein the first electrode of the touch panel is formed on a protective film made of an inorganic insulation film for covering the cathode.

16. The organic EL display device according to claim 11, wherein the second electrode of the touch panel faces the first electrode of the touch panel via an adhesive.

17. The organic EL display device according to claim 11, wherein the second electrode of the touch panel receives a detection signal supplied from the TFT substrate.

18. The organic EL display device according to claim 11, wherein the TFT substrate is made of polyimide.

19. The organic EL display device according to claim 11, wherein the counter substrate is made of glass.

* * * * *